(12) United States Patent
Hanyu et al.

(10) Patent No.: US 9,324,429 B2
(45) Date of Patent: Apr. 26, 2016

(54) SEMICONDUCTOR STORAGE DEVICE

(71) Applicant: TOHOKU UNIVERSITY, Sendai-shi, Miyagi (JP)

(72) Inventors: Takahiro Hanyu, Sendai (JP); Shoun Matsunaga, Sendai (JP); Naoya Onizawa, Montreal (CA); Vincent Gaudet, Waterloo (CA)

(73) Assignee: TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 14/399,041

(22) PCT Filed: May 3, 2013

(86) PCT No.: PCT/JP2013/062791
§ 371 (c)(1),
(2) Date: Nov. 5, 2014

(87) PCT Pub. No.: WO2013/168685
PCT Pub. Date: Nov. 14, 2013

(65) Prior Publication Data
US 2015/0109842 A1    Apr. 23, 2015

(30) Foreign Application Priority Data
May 6, 2012    (JP) .................................. 2012-105558

(51) Int. Cl.
*G11C 15/00*    (2006.01)
*G11C 15/04*    (2006.01)

(52) U.S. Cl.
CPC ................. *G11C 15/04* (2013.01); *G11C 15/00* (2013.01)

(58) Field of Classification Search
CPC ............. G11C 15/00; G11C 8/08; G11C 8/12
USPC .................... 365/49.1, 49.16, 49.17
See application file for complete search history.

(56) References Cited

U.S. PATENT DOCUMENTS 3,997,882 A  *  12/1976  Goyal .......................... 365/49.1
5,034,919 A      7/1991  Sasai et al.
(Continued)

FOREIGN PATENT DOCUMENTS

JP    2-308499 A    12/1990
JP    3-212896 A     9/1991
(Continued)

OTHER PUBLICATIONS

Onizawa et al., Presentation Slides "High-Throughput Low-Energy Content-Addressable Memory Based on Self-Timed Overlapped Search Mechanism," May 12, 2007, slides 32.*
(Continued)

*Primary Examiner* — Son Dinh
*Assistant Examiner* — Uyen B Tran
(74) *Attorney, Agent, or Firm* — Westerman, Hattori, Daniels & Adrian, LLP

(57) ABSTRACT

A semiconductor storage device 1 includes: an input controller (3); and a content-addressable memory block (2) connected to the input controller (3). Each word circuit (4) of the content-addressable memory block (2) includes: a k-bit 1st-stage sub word (4a) connected to search line 1 (SL1) of the input controller (3); and an (n-k)-bit 2nd-stage sub word (4b) connected to search line 2 (SL2) of the input controller (3). The k-bit 1st-stage sub word (4a) and the (n-k)-bit 2nd-stage sub word (4b) are separated by a segmentation circuit (5). When the 1st-stage sub word outputs a match signal, the match result is stored in the segmentation circuit (5), and a plurality of local match circuits within the 2nd-stage sub word (4b) are operated.

13 Claims, 18 Drawing Sheets

(56) References Cited

U.S. PATENT DOCUMENTS

| | | | |
|---|---|---|---|
| 5,485,418 | A | 1/1996 | Hiraki et al. |
| 2002/0080665 | A1* | 6/2002 | Hata ............................ 365/200 |
| 2006/0233011 | A1* | 10/2006 | Matsuoka et al. ............. 365/49 |
| 2008/0151588 | A1* | 6/2008 | Agarwal et al. .............. 365/49.1 |

FOREIGN PATENT DOCUMENTS

| | | |
|---|---|---|
| JP | 6-333395 A | 12/1994 |
| JP | 7-14391 A | 1/1995 |
| JP | 2006-236515 A | 9/2006 |
| JP | 2013-37750 A | 2/2013 |

OTHER PUBLICATIONS

Meribout et al., "On Using the CAM Concept for Parametric Curve Extraction", IEEE Transactions on Image Processing, Dec. 2000, pp. 2126-2130, vol. 9, No. 12, cited in the specification.

Nakanishi et al., "A Real-time CAM-based Hough Transform Algorithm and Its Performance Evaluation", Proc. 13th International Conference on Pattern Recognition, Aug. 1996, pp. 516-521, vol. 2, cited in the specification.

Craft, "A fast hardware data compression algorithm and some algorithmic extensions", IBM Journal of Research and Development, Nov. 1998, pp. 733-746, vol. 42, No. 6, cited in the specification.

Choi et al., "A 24.2-μW Dual-Mode Human Body Communication Controller for Body Sensor Network", Proc. 32nd European Solid-State Circuits Conference, Sep. 2006, pp. 227-230, cited in the specification.

Choi et al., "A TCAM-based Periodic Event Generator for Multi-Node Management in the Body Sensor Network", Proc. Asian Solid-State Circuits Conference, Nov. 2006, pp. 307-310, cited in the specification.

Lin et al., "A 1-V 128-kb Four-Way Set-Associative CMOS Cache Memory Using Wordline-Oriented Tag-Compare (WLOTC) Structure with the Content-Addressable-Memory (CAM) 10-Transistor Tag Cell", IEEE Journal of Solid-State Circuits, Apr. 2001, pp. 666-675, vol. 36, No. 4, cited in the specification.

Wang et al., "An Adaptively Dividable Dual-Port BiTCAM for Virus-Detection Processors in Mobile Devices", IEEE Journal of Solid-State Circuits, May 2009, pp. 1571-1581, vol. 44, No. 5, cited in the specification.

Huang et al., "Fast and Scalable Multi-TCAM Classification Engine for Wide Policy Table Lookup", Proc. 19th International Conference on Advanced Information Networking and Applications, Mar. 2005, pp. 792-797, vol. 1, cited in the specification.

Kobayashi et al., "A Longest Prefix Match Search Engine for Multi-Gigabit IP Processing", IEEE International Conference on Communications, 2000, pp. 1360-1364, vol. 3, cited in the specification.

Tang et al., "A TCAM Index Scheme for IP Address Lookup", Proc. First International Conference on Communications and Networking in China, Oct. 2006, pp. 1-5, cited in the specification.

Huang et al., "Design of Multi-field IPv6 Packet Classifiers Using Ternary CAMs", Proc. Global Telecommunications Conference, 2001, pp. 1877-1881, vol. 3, cited in the specification.

Pagiamtzis et al., "Content-Addressable Memory (CAM) Circuits and Architectures: A Tutorial and Survey", IEEE Journal of Solid-State Circuits, Mar. 2006, pp. 712-727, vol. 41, No. 3, cited in the specification.

Shafai et al., "Fully Parallel 30-MHz, 2.5-Mb CAM", IEEE Journal of Solid-State Circuits, Nov. 1998, pp. 1690-1696, vol. 33, No. 11, cited in the specification.

Li et al., "An AND-Type Match-Line Scheme for High-Performance Energy-Efficient Content Addressable Memories", IEEE Journal of Solid-State Circuits, May 2006, pp. 1108-1119, vol. 41, No. 5, cited in the specification.

Wang et al., "High-Speed and Low-Power Design Techniques for TCAM Macros", IEEE Journal of Solid-State Circuits, Feb. 2008, pp. 530-540, vol. 43, No. 2, cited in the specification.

Arsovski et al., "A Ternary Content-Addressable Memory (TCAM) Based on 4T Static Storage and Including a Current-Race Sensing Scheme", IEEE Journal of Solid-State Circuits, Jan. 2003, pp. 155-158, vol. 38, No. 1, cited in the specification.

Arsovski et al., "A Mismatch-Dependent Power Allocation Technique for Match-Line Sensing in Content-Addressable Memories", IEEE Journal of Solid-State Circuits, Nov. 2003, pp. 1958-1966, vol. 38, No. 11, cited in the specification.

Pagiamtzis et al., "Pipelined Match-Lines and Hierarchical Search-Lines for Low-Power Content-Addressable Memories", IEEE Custom Integrated Circuits Conference, 2003, pp. 383-386, cited in the specification.

Pagiamtzis et al., "A Low-Power Content-Addressable Memory (CAM) Using Pipelined Hierarchical Search Scheme", IEEE Journal of Solid-State Circuits, Sep. 2004, pp. 1512-1519, vol. 39, No. 9, cited in the specification.

Zukowski et al., "Use of Selective Precharge for Low-Power on the Match Lines of Content-Addressable Memories", Proc. International Workshop on Memory Technology, Design and Testing, Aug. 1997, pp. 64-68, cited in the specification.

Baeg, "Low-Power Ternary Content-Addressable Memory Design Using a Segmented Match Line", IEEE Transactions on Circuits and Systems I: Regular Papers, Jul. 2008, pp. 1485-1494, vol. 55, No. 6, cited in the specification.

Choi et al. "A 0.7-fJ/Bit/Search 2.2-ns Search Time Hybrid-Type TCAM Architecture", IEEE Journal of Solid-State Circuits, Jan. 2005, pp. 254-260, vol. 40, No. 1, cited in the specification.

Lin et al., "A Low-Power Precomputation-Based Fully Parallel Content-Addressable Memory", IEEE Journal of Solid-State Circuits, Apr. 2003, pp. 654-662, vol. 38, No. 4, cited in the specification.

Huang et al., "A 65 nm 0.165 fJ/Bit/Search 256×144 TCAM Macro Design for IPv6 Lookup Tables", IEEE Journal of Solid-State Circuits, Feb. 2011, pp. 507-519, vol. 46, No. 2, cited in the specification.

Hanzawa et al., "A Large-Scale and Low-Power CAM Architecture Featuring a One-Hot-Spot Block Code for IP-Address Lookup in a Network Router", IEEE Journal of Solid-State Circuits, Apr. 2005, pp. 853-861, vol. 40, No. 4, cited in the specification.

International Search Report dated Jun. 4, 2013, issued in corresponding application No. PCT/JP2013/062791.

* cited by examiner (b)

SEMICONDUCTOR STORAGE DEVICE

TECHNICAL FIELD

The present invention relates to a semiconductor storage device. More specifically, the present invention relates to the semiconductor storage device that operates at high speed while consuming low energy.

BACKGROUND ART

A content-addressable memory (CAM), a type of semiconductor memories, is used as a high-speed and low-power functional memory. The CAM executes the lookup-table function that compares an input search word with a table of stored words, and returns the matching word at high speed by a fully parallel equality-search manner.

The CAM is used for applications such as parametric curve extraction (Non-patent Literature 1), the Hough transformation used by the feature extraction method for digital image processing and conversion (Non-patent Literature 2), the Lempel-Ziv compression, which is one of data compression algorithms (Non-patent Literature 3), the human body communication controller (Non-patent Literature 4), the periodic event generator (Non-patent Literature 5), the cache memory (Non-patent Literature 6), and the virus-detection processor (Non-patent Literature 7).

At present, CAMs are mainly used for the packet control by network routers and network switches (Non-patent literatures 8 to 11).

FIG. 18 is a block diagram showing the structure of the CAM of the prior art. As shown in FIG. 18, the CAM 100 of the prior art includes: an input controller 102, word blocks 103 namely memory areas, and an encoder 104. An input search word is transmitted from search lines (SL) to a block (also called a table) 103 of stored words. The number of bits in the CAM 100 usually ranges from 36 to 144 bits. The typical CAM 100 employs a table size ranging between a few hundred to 32K entries. Each entry or word circuit contains several dozens of CAM cells. Each word block 103 has a match line (ML) that indicates whether the search word and stored word are the same or different.

The comparison result of each CAM cell with an input-search bit is determined by whether a pass transistor in the CAM cell attached to the match line (ML) is in ON or OFF state. MLs are connected to the encoder 104. The encoder 104 generates a binary match location (address) corresponding to the ML that is in the match state.

The word blocks or word circuits are normally implemented based on the dynamic logic (Non-patent Literature 12), and are classified into NOR-type (Non-patent Literature 12) and NAND-type (Non-patent Literatures 13 to 15) ones.

In the NOR-type word circuit, since the pass transistors of the NOR-type CAM cells are connected between the ML and the ground line in parallel, the word circuit operates at high speed. Since most of the stored words mismatch the input search word in the CAM, most of the word circuits are in the mismatch state. Hence, the mismatched word circuit discharges the ML capacitance in the NOR-type cell frequently, and thus consumes large power.

The NOR-type CAM cell operates at high speed but consumes large power. To decrease power dissipation of the MLs with low noise immunity, the low-voltage-swing approaches using the current-mode circuits have been proposed (Non-patent Literatures 16 and 17).

In contrast, with a NAND-type CAM cell, since pass transistors are connected between the MLs and the ground line in series in the NAND-type word circuit, the word circuit operates at medium speed. Since the matched word circuits only discharge their ML capacitances, the NAND-type word circuits consume less power than those of the NOR-type word circuits.

The NAND-type CAM cell consumes less power, but operates at medium speed. Hence, to improve the throughput of the NAND-type CAM cell, the pseudo-footless clock-and-data precharged dynamic (PF-CDPD) gate has been proposed (Non-patent Literatures 14 and 15).

In the conventional synchronous CAM, the next search word is assigned after the current search is completed. The throughput of the conventional synchronous CAM is restricted by the number of bits of the CAM word because the worst-case delay of the match operation is usually proportional to the number of bits of the word.

The CAM performs search among the memory cell for storing several hundred or more words and the input data in parallel, and outputs the address of matched words. The whole of the conventional synchronous CAM is collectively controlled using clock signals, and its speed is determined by the overall delay based on the bit length of the word circuit. In IPv6, namely the next-generation Internet protocol (communication procedure), the bit length of the word reaches as long as 144 bits or longer, thus causing the speed of the CAM to decrease. Furthermore, due to increase in network traffic in recent years, the number of entries to be stored has been increased, hence the power consumption is increasing.

As the conventional CAM word circuit method, the method of segmenting the word circuit to decrease power consumption is known. With this method, by segmenting the word circuit, the search is performed with initial several bits first, the match or the mismatch state is judged, and thus by stopping the operation of the most of the remaining word circuits, the decrease in power consumption was attempted. With this method, however, it is necessary to add a sense amplifier, etc. between segments, which causes delay to increase. This delay of the entire word circuit is determined by the sum total of the delay of each segment and that of each sense amplifier.

As a method of achieving high-speed operation while maintaining the effect of decreasing power consumption of this segmentation method, the circuit using a pipeline has been proposed at the architecture level to improve the throughput of the CAM cell (Non-patent Literatures 18 and 19).

CITATION LIST

Patent Literature

Patent Literature 1: JP 2006-236515 A

Non-Patent Literature

Non-Patent Literature 1: M. Meribout, T. Ogura, and M. Nakanishi, "On using the CAM concept for parametric curve extraction", IEEE Transactions on Image Processing, vol. 9, no. 12, pp. 2126-2130, December 2000

Non-Patent Literature 2: Nakanishi and T. Ogura, "A real-time CAM-based Hough transform algorithm and its performance evaluation", Proc. 13th International Conference on Pattern Recognition, 1996, vol. 2, pp. 516-521, August 1996

Non-Patent Literature 3: D. J. Craft, "A fast hardware data compression algorithm and some algorithmic extensions", IBM Journal of Research and Development, vol. 42, no. 6, pp. 733-746, November 1998

Non-Patent Literature 4: S. Choi, S.-J. Song, K. Sohn, H. Kim, J. Kim, N. Cho, J.-H. Woo, J. Yoo, and H.-J. Yoo, "A 24.2-mW dual-mode human body communication controller for body sensor network", Proc. 32nd European Solid-State Circuits Conference, 2006, pp. 227-230, September 2006

Non-Patent Literature 5: S. Choi, K. Sohn, J. Kim, J. Yoo, and H.-J. Yoo, "A TCAM-based periodic event generator for multi-node management in the body sensor network", Proc. Asian Solid-State Circuits Conference, 2006, pp. 307-310, November 2006

Non-Patent Literature 6: P.-F. Lin and J. Kuo, "A 1-V 128-kb four-way set-associative cmos cache memory using word-line-oriented tag-compare (WLOTC) structure with the content-addressable-memory (CAM) 10-transistor tag cell", IEEE Journal of Solid-State Circuits, vol. 36, no. 4, pp. 666-675, April 2001

Non-Patent Literature 7: C.-C. Wang, C.-J. Cheng, T.-F. Chen, and J.-S. Wang, "An adaptively dividable dual-port bitcam for virus-detection processors in mobile devices", IEEE Journal of Solid-State Circuits, vol. 44, no. 5, pp. 1571-1581, May 2009

Non-Patent Literature 8: N.-F. Huang, K.-B. Chen, and W.-E. Chen, "Fast and scalable multi-TCAM classification engine for wide policy table lookup", Proc. 19th International Conference on Advanced Information Networking and Applications, 2005, vol. 1, pp. 792-797, March 2005

Non-Patent Literature 9: M. Kobayashi, T. Murase, and A. Kuriyama, "A longest prefix match search engine for multi-gigabit IP processing", IEEE International Conference on Communications, 2000, vol. 3, pp. 1360-1364, 2000

Non-Patent Literature 10: Y. Tang, W. Lin, and B. Liu, "A TCAM index scheme for IP address lookup", Proc. First International Conference on Communications and Networking in China, pp. 1-5, October 2006

Non-Patent Literature 11: N.-F. Huang, W.-E. Chen, J. Y. Luo, and J.-M. Chen, "Design of multifield IPv6 packet classifiers using ternary CAMs", Proc. Global Telecommunications Conference, 2001, vol. 3, pp. 1877-1881, 2001

Non-Patent Literature 12: K. Pagiamtzis and A. Sheikholeslami, "Content-addressable memory (CAM) circuits and architectures: a tutorial and survey", IEEE Journal of Solid-State Circuits, vol. 41, no. 3, pp. 712-727, March 2006

Non-Patent Literature 13: F. Shafai, K. Schultz, G. Gibson, A. Bluschke, and D. Somppi, "Fully parallel 30-MHz, 2.5-Mb CAM", IEEE Journal of Solid-State Circuits, vol. 33, no. 11, pp. 1690-1696, November 1998

Non-Patent Literature 14: H.-Y. Li, C.-C. Chen, J.-S. Wang, and C. Yeh, "An AND-type matchline scheme for high-performance energy-efficient content addressable memories", IEEE Journal of Solid-State Circuits, vol. 41, no. 5, pp. 1108-1119, May 2006

Non-Patent Literature 15: C.-C. Wang, J.-S. Wang, and C. Yeh, "High-speed and low-power design techniques for TCAM macros", IEEE Journal of Solid-State Circuits, vol. 43, no. 2, pp. 530-540, February 2008

Non-Patent Literature 16: I. Arsovski, T. Chandler, and A. Sheikholeslami, "A ternary content addressable memory (TCAM) based on 4T static storage and including a current-race sensing scheme", IEEE Journal of Solid-State Circuits, vol. 38, no. 1, pp. 155-158, January 2003

Non-Patent Literature 17: I. Arsovski and A. Sheikholeslami, "A mismatch-dependent power allocation technique for match-line sensing in content-addressable memories", IEEE Journal of Solid-State Circuits, vol. 38, no. 11, pp. 1958-1966, November 2003

Non-Patent Literature 18: K. Pagiamtzis and A. Sheikholeslami, "Pipelined Match-Lines and Hierarchical Search-Lines for Low-Power Content-Addressable Memories", IEEE Custom Integrated Circuits Conference, pp. 383-386, 2003

Non-Patent Literature 19: K. Pagiamtzis and A. Sheikholeslami, "A low-power content-addressable memory (CAM) using pipelined hierarchical search scheme", IEEE Journal of Solid-State Circuits, vol. 39, no. 9, pp. 1512-1519, September 2004

Non-Patent Literature 20: C. Zukowski and S.-Y. Wang, "Use of selective precharge for low-power on the match lines of content-addressable memories", Proc. International Workshop on Memory Technology, Design and Testing, 1997, pp. 64-68, August 1997

Non-Patent Literature 21: S. Baeg, "Low-power ternary content-addressable memory design using a segmented match line", IEEE Transactions on Circuits and Systems I: Regular Papers, vol. 55, no. 6, pp. 1485-1494, July 2008.

Non-Patent Literature 22: S. Choi, K. Sohn, and H.-J. Yoo, "A 0.7-fJ/bit/search 2.2-ns search time hybrid-type TCAM architecture", IEEE Journal of Solid-State Circuits, vol. 40, no. 1, pp. 254-260, January 2005

Non-Patent Literature 23: C.-S. Lin, J.-C. Chang, and B.-D. Liu, "A low-power precomputation-based fully parallel content-addressable memory", IEEE Journal of Solid-State Circuits, vol. 38, no. 4, pp. 654-662, April 2003

Non-Patent Literature 24: P.-T. Huang and W. Hwang, "A 65 nm 0.165 fJ/bit/search 256×144 TCAM macro design for IPv6 lookup tables", IEEE Journal of Solid-State Circuits, vol. 46, no. 2, pp. 507-519, February 2011

Non-Patent Literature 25: S. Hanzawa, T. Sakata, K. Kajigaya, R. Takemura, and T. Kawahara, "A large-scale and low-power CAM architecture featuring a one-hot-spot block code for IP-address lookup in a network router", IEEE Journal of Solid-State Circuits, vol. 40, no. 4, pp. 853-861, April 2005

SUMMARY OF INVENTION

Technical Problem

With the conventional method of segmenting a word circuit to decrease the power consumption of the CAM, the delay time increases, thus hindering the high-speed operation.

With the pipeline method for achieving high-speed operation while maintaining the effect of decreasing power consumption achieved by the segmentation method described previously, the power consumption increases significantly due to pipeline registers inserted between segments, and also chip area increases as a result of installation of the pipeline registers.

With the method of doubling the memory disclosed in Patent Literature 1, since the memory area is doubled, both the area and the power consumption increase significantly.

In view of the above problems, the object of the present invention is to provide a semiconductor storage device that operates at short delay time with low power consumption.

Solution to Problem

To solve the above problem, the present invention provides a semiconductor storage device, comprising: an input controller including a register, a comparator, and a mode controller; and a content-addressable memory block connected to the input controller, wherein each word circuit of the content-addressable memory block comprises: a k-bit 1st-stage sub-word circuit connected to search line 1 of the input controller; and an (n-k)-bit 2nd-stage sub-word circuit connected to search line 2 of the input controller, and the k-bit 1st-stage sub-word circuit and the (n-k)-bit 2nd-stage sub-word circuit are connected via a segmentation circuit.

In the above configuration, the 2nd-stage sub-word circuit may preferably comprise: further divided sub-sub-word circuits; local match circuits respectively connected to the sub-sub-word circuits; and a global match circuit of the entire sub-sub-word circuits. The number of bits of the sub-sub-word circuits is preferably k bits.

The input controller may preferably operate in fast and slow modes. The input controller may preferably operate in the fast mode, after judging that the k-bit first-stage sub word does not match a search word so as to continue a series of match operations for different inputs. The input controller may preferably operate in the slow mode after judging that the k-bit 1st-stage sub word matches the search word.

In a search performed by the content-addressable memory block, match lines in each word circuit are preferably charged before next search is performed, and only the match lines that match in the word circuit are charged by a local control signal generated in the word circuit.

In a search performed by the content-addressable memory block, match lines in each word circuit are preferably charged before next search is performed, and the match lines of the word circuit are charged after the global match circuit of the word circuit is operated.

In the above configuration, the match circuit is preferably asynchronously or synchronously controlled on a word to word basis.

The input controller is preferably driven by a synchronous or asynchronous signal.

The content-addressable memory block may preferably comprise binary content-addressable memory cells or ternary content-addressable memory cells.

The word circuit may preferably include a self-precharge circuit.

The match circuit may preferably be asynchronously controlled on a word to word basis, match lines of a matched word are self-precharged by a local control signal after a series of operations of judging match between a search word and a stored word, and the delay time $T_{PA}$ in the self-precharge is operated so as not to affect the cycle time $T_{CA}$ of the content-addressable memory block.

Advantageous Effects of Invention

According to the present invention, the high-speed and low-power-consumption CAM based on independent control on the word to word basis can be provided. Specifically, since the cycle time of search operation is determined not by the entire delay of the word circuit, namely the worst case of the conventional synchronous CAM, but by a small partial delay in the initial partial word circuit achieved by segmentation, the higher operation than the conventional CAM is ensured.

Furthermore, as the method of achieving the word circuit, the asynchronous control method can be used to ensure the independent operation on the word to word basis. Consequently, the power consumed by clock signals can be decreased without using pipeline registers, etc. At the same time, the circuit not affected by the worst delay can be achieved. Of course, such word circuits can also be achieved by using the synchronous circuit for the independent operation per word. The word circuit segmentation method of the present invention also has the effect of decreasing the power consumption achieved by the conventionally known segmentation method.

Figure 1:
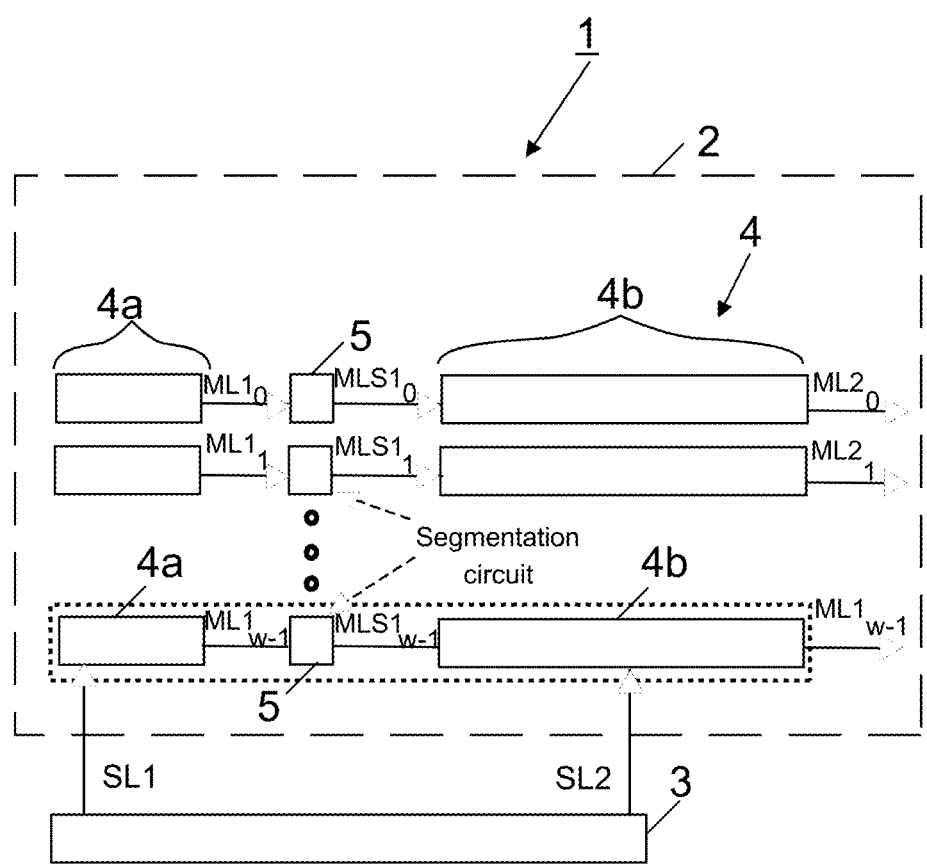
FIG. 1 is a block diagram showing a structure of a semiconductor storage device of the present invention.

REFERENCE SIGNS LIST 1, 1A: Semiconductor memory device
2: CAM block
3: Input control unit
4: Word block
4a: k-bit sub word
4b: (n-k)-bit sub word
5, 55: Segmentation circuit
12, 13, 14: Register
16: Comparator
18: Mode control unit
20: Word circuit
21: Pass transistor
30: BCAM cell
32: Flip-flop
33, 84: Transfer transistor
40: Self-timed word circuit
42: Synchronous word circuit
50: Word circuit that includes the WOS and POP schemes
54a: 8-bit first-stage sub-word circuit
54b: 136-bit 2nd-stage sub-word circuit
56: Self-precharge circuit
58: NAND-type cell (sub-sub-word circuit)
60, 76: PMOS transistor for self-precharge 62: Weak feedback PMOS transistor
70: Local match circuit
71: Inverter
72: Global match circuit
74: NMOS transistor
78: AND gate
80: TCAM
81: First memory cell having NAND-type cell
82: Second memory cell having NAND-type cell
85: Transfer transistor for ML

DESCRIPTION OF EMBODIMENTS

The embodiments of the present invention will hereinafter be described in detail by referring to drawings.
(Word-Overlapped Search)

FIG. 1 is a block diagram showing a semiconductor storage device 1 adopting a word-overlapped search scheme (WOS scheme) according to the present invention.

As shown in FIG. 1, the semiconductor storage device 1 of the present invention includes: a CAM block 2; and an input controller 3. The semiconductor storage device 1 of the present invention is also called a content-addressable memory (CAM).

The CAM block 2 contains a word block (word circuit) 4 of a plurality of words (w word) for storing n-bit words, and operates based on self-control or synchronous control.

The word block 4 includes: a small k-bit sub word 4a; a segmentation circuit 5 connected to the k-bit sub word 4a; and a subsequent (n-k)-bit sub word 4b connected to the output side of the segmentation circuit 5. In other words, in the word block 4, the small k-bit sub word 4a and the large subsequent (n-k)-bit sub word 4b are separated by the segmentation circuit 5. The k-bit sub word 4a is connected to search line 1 (SL1) of the input controller 3. The (n-k)-bit sub word 4b is connected to search line 2 (SL2) of the input controller 3.

This segmentation method is usually used to reduce the switching activity of the subsequent word blocks 4 (Non-patent Literatures 20 and 21).

As the word, the binary CAM (BCAM) for storing binary data or the ternary CAM (TCAM) for storing ternary data is applicable. Unless otherwise specified, the following description assumes that the semiconductor storage device 1 is BCAM.

In the semiconductor storage device 1, most of the stored words mismatch an input search word by the match operation of the first few bits of the search word. Assuming that the stored words have the uniform random distribution, the probability of a match after the first k-bit search is given by Equation (1) as shown below.

$$p_{matched} = \left(\frac{1}{2}\right)^k \quad (1)$$

After the first k-bit search, most of the mismatched word blocks 4 are not used. To enhance the throughput, the present invention uses these unused blocks. In the semiconductor storage device 1 of the present invention, the search word is processed at a rate based on the short delay of the first segment ($T_{1st}$) rather than the long delay of the whole word block 4 ($T_{slow}$). In other words, as soon as the first k-bit search is completed, the next k-bit sub word 4a is entered. As long as consecutive k-bit sub words are different, search words are assigned to unused different word blocks 4 at a rate based on short delay time ($T_{1st}$).

If the consecutive sub words are found to be the same, then the next search is initiated once the current search is completed in both segments.

Hence, the average search time $T_{SA}$ based on the search method of the present invention is given by Equation (2) as shown below.

$$T_{SA} = T_{1st}\left(1 - m\left(\frac{1}{2}\right)^k\right) + T_{slow}\left(m\left(\frac{1}{2}\right)^k\right) \quad (2)$$

In the above equation, m is the number of subsequent sub words to be compared.

A scheduling of the input data is controlled by the synchronously operating input controller 3.

Figure 2:
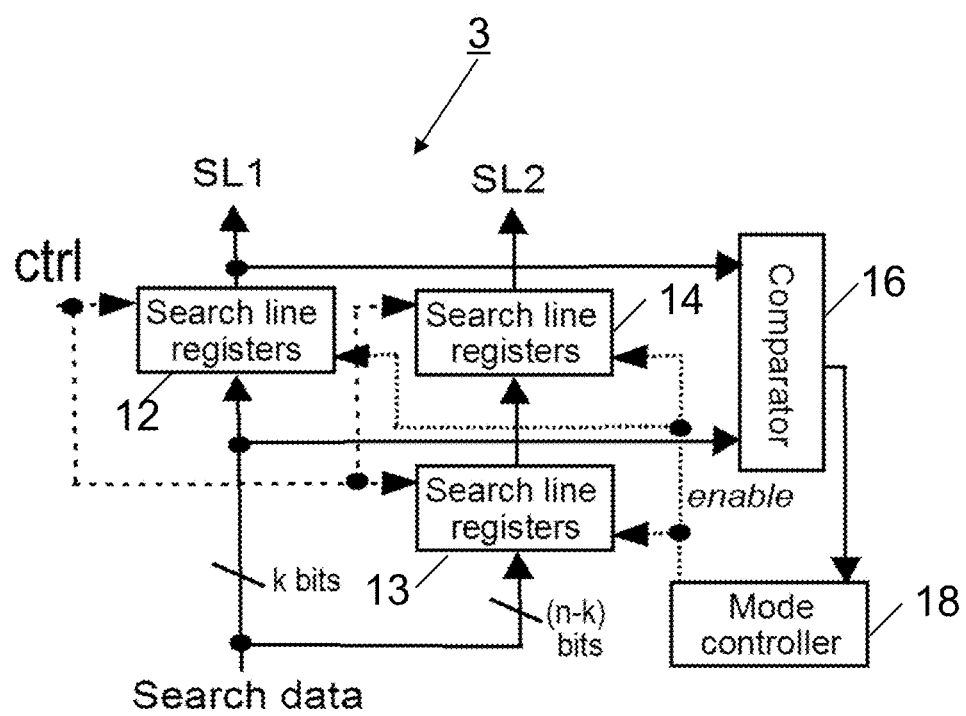
FIG. 2 is a block diagram showing the structure of the input controller with m=1.

FIG. 2 is a block diagram showing the structure of the input controller 3 when m is set to 1. The input controller 3 includes: registers 12 to 14; a k-bit comparator 16; and a mode controller 18. The comparator 16 is also called a comparison circuit. The mode controller 18 operates in two modes: fast and slow. The input controller 3 is designed based on synchronous circuit scheme. This method is categorized into a pre-computation method because search words are processed before they are searched in CAM block 2 (Non-patent Literatures 20, 21).

The search word is divided into k-bit sub word 4a and (n-k)-bit sub word 4b. To check consecutive k-bit sub words that match in the same first segment, these sub words are compared in the comparator 16. When these sub words are not the same, the input controller 3 sends the search words to the CAM block 2 at time $T_{1st}$.

Figure 3:
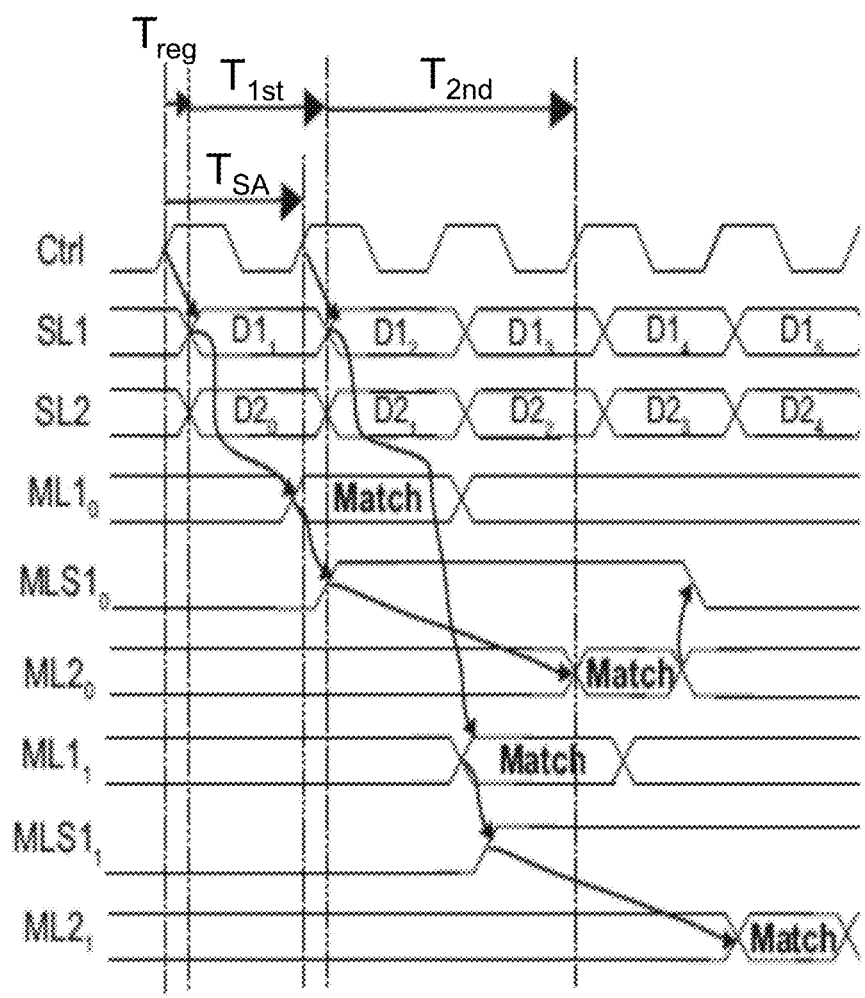
FIG. 3 is a figure showing the time chart of the input controller and CAM blocks operating in fast mode.

FIG. 3 is a time chart of the input controller 3 and the CAM block 2, which operate in the fast mode. As shown in FIG. 3, the input controller 3 sends a k-bit sub word (D1) 4a and (n-k)-bit sub word (D2) 4b onto SL1 and SL2, respectively, in different cycles.

First, $D1_1$ matches the k-bit first segment ($ML1_0$), and the matched result is stored in the segmentation circuit 5.

Second, $D2_1$, namely (n-k)-bit sub word 4b, matches the segment after k bit ($ML2_0$). Concurrently, $D1_2$ is processed in another first segment ($ML1_0$). When consecutive sub words D1 are not the same, since this another first segment is judged to be mismatch at the time of previous match operation, the internal state of the word circuit is maintained as it is. The match operation is the operation to judge the match between the search word and the stored words. The circuit that performs this operation is the match circuit. It is therefore possible to continue the match operation of different inputs consecutively. When the consecutive D1 are the same, the input controller 3 operates in the slow mode.

Figure 4:
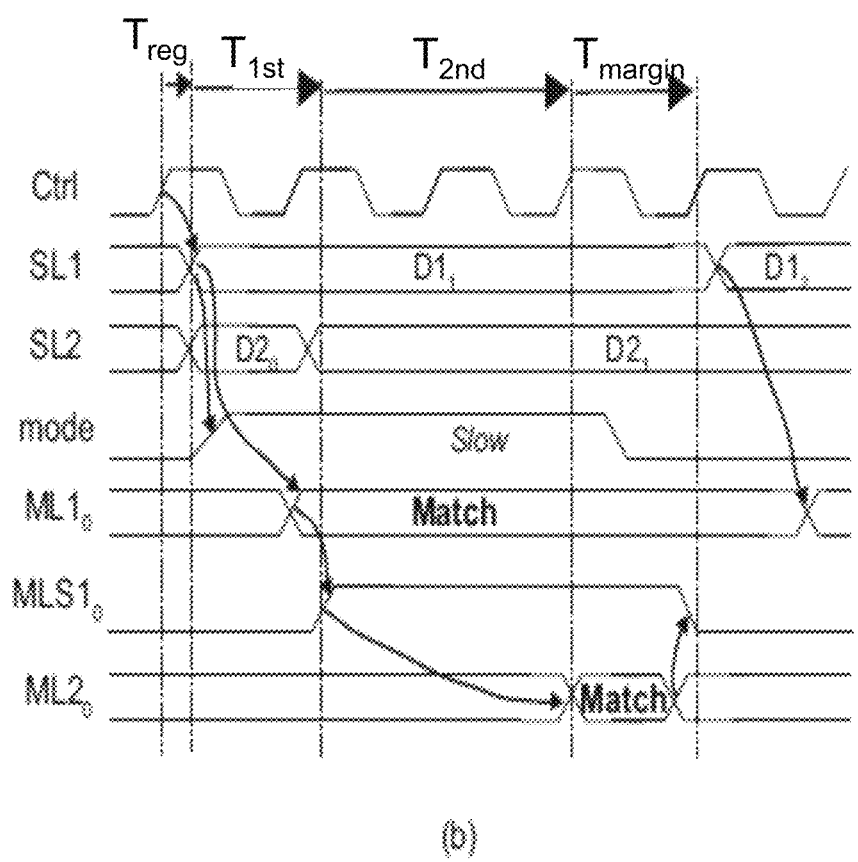
FIG. 4 is a figure showing the time chart of the input controller and CAM blocks operating in the slow mode.

FIG. 4 is a time chart of the input controller 3 and the CAM block 2, which operate in the slow mode. Since ML is discharged once each word circuit 4 is judged to match, it is necessary to be pre-charging the ML before the next search, namely match operation, is performed. When consecutive D1 are the same, ML is discharged in the same word circuit 4. It is therefore necessary to wait until the match operation in the previous and subsequent segments is completed and the pre-charging of the ML is completed. As described above, in the slow mode, the input controller 3 stops transmitting new search words until the current search is completed in CAM block 2. The delay time in the slow mode is given by the Equation (3) as shown below.

$$T_{slow} = T_{reg} + T_{1st} + T_{2nd} + T_{margine} \quad (3)$$

In the above equation, $T_{reg}$, $T_{2nd}$ and $T_{margine}$ are the delay time from the input controller 3 to the CAM block 2, the delay time of the (n-k)-bit subsequent segment, and the delay time of the mode transition from slow to fast, respectively.

After the slow mode, the input controller 3 operates in the fast mode. In fact, once the search word input from the SL of the input controller 3 matches in the word block 4, the word block 4 cannot be used during $T_{slow}$. Hence, m in the Equation (2) as shown above, namely the number of subsequent sub words to be compared, needs to satisfy the conditions given by Equation (4) as shown below.

$$(m+1)T_{SA} = T_{reg} + T_{1st} + T_{2nd} + T_{margine} \quad (4)$$

Let's assume that k is assumed to be 8, and the average search time $T_{SA}$ given by Equation (2) as shown above is assumed to be almost determined by $T_{1st}$. Furthermore, the comparator 16 of the input controller 3 is assumed to be small.

(Conventional CAM)

Meanwhile, the conventional synchronous CAM assigns the next search word after the current search is completed. Hence, the search time ($T_{SS}$) of the conventional synchronous CAM is given by Equation (5) as shown below.

$$T_{SS} = T_{reg} + T_{1st} + T_{2nd} \quad (5)$$

In the above equation, $T_{2nd}$ is determined by the delay time of the (n-k)-bit subsequent segment. For example, when used for address searches by IPv6 for example, a next-generation Internet protocol (communication procedure), the word bit length is 144 bits. In other words, when n is 144 and k is 8 as in the case of IPv6, n-k is 136.

The operation of the semiconductor storage device 1 of the present invention will be described.

For example, the word search is divided into two stages, and in the first-stage search, the word search for the initial several bits only is performed. Since the semiconductor storage device 1 can judge most of the word circuits 4 to mismatch by the word search of the initial several bits only, most of the second-stage long word circuits 4 are not used, and the internal state is maintained as it is. The next word search can be executed continuously. By assigning the input data to this unused word circuit 4, namely by providing a control circuit to be executed into the input controller 3 of the semiconductor storage device 1, the semiconductor storage device 1 is allowed to start the word search of the next data when the first-stage search is completed.

Accordingly, unlike the conventional CAM, the speed of the semiconductor storage device 1 does not depend on the word bit length, and thus the fast operation depending on partial delay of the bit length of the small word in the first stage is ensured.

(Phase Overlapped Processing)

Next, a phase overlapped processing (hereinafter referred as POP in short) based on the self-control in word blocks 4 of the semiconductor storage device 1 will hereinafter be described.

Figure 5:
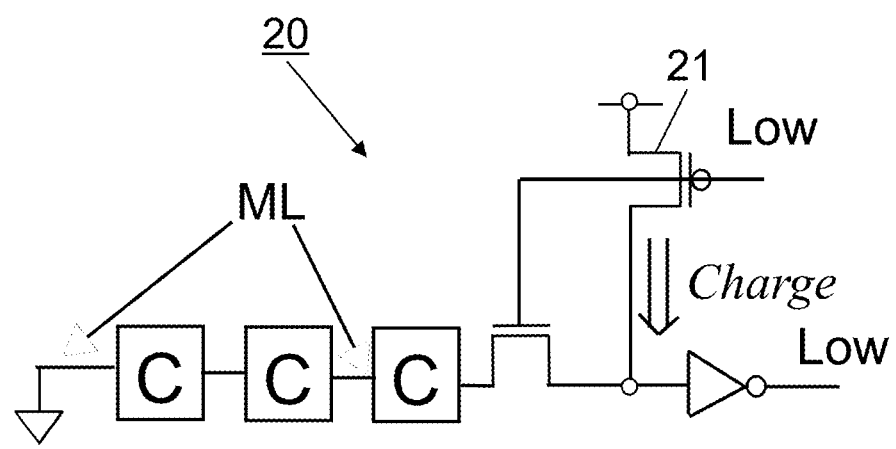
FIG. 5 is a block diagram showing the precharged state.
Figure 6:
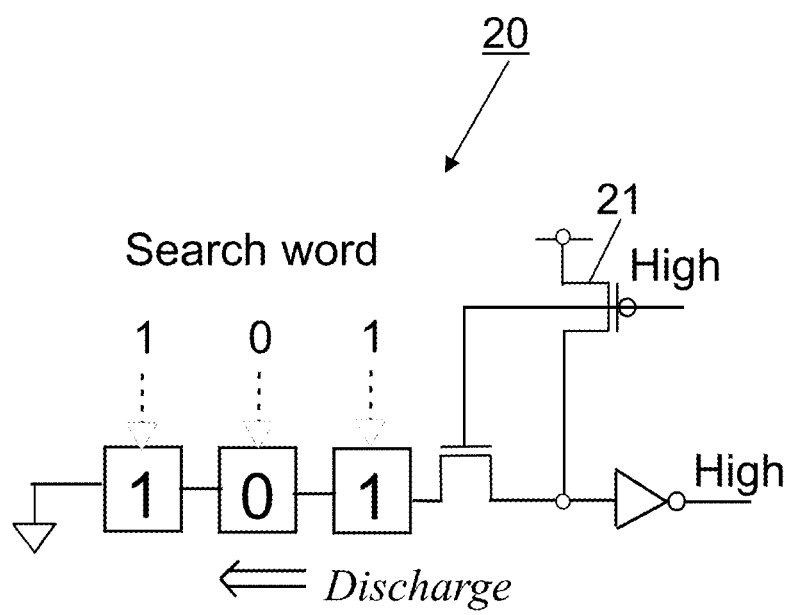
FIG. 6 is a block diagram showing the matched state.
Figure 7:
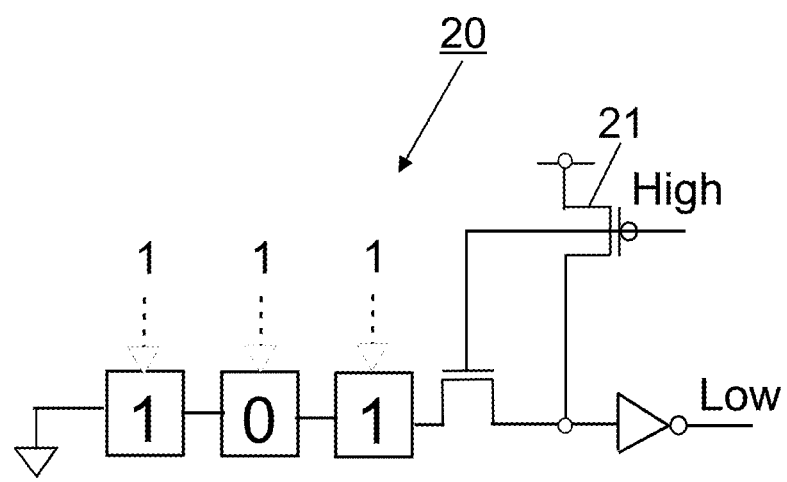
FIG. 7 is a block diagram showing the mismatched state.
Figure 8:
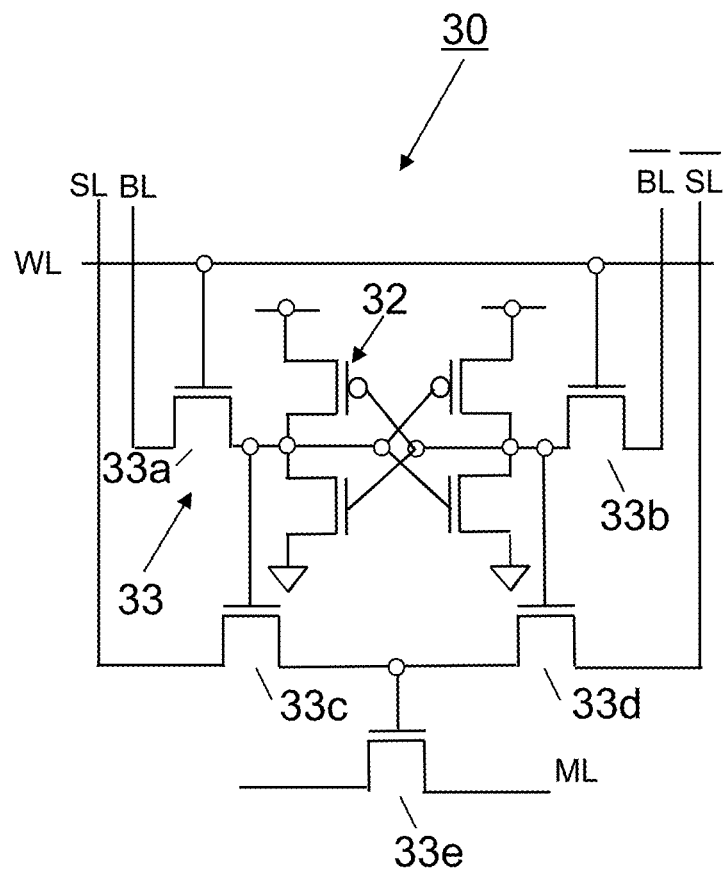
FIG. 8 is a circuit diagram of a binary NAND-type CAM cell.

FIGS. 5 to 8 are block diagrams of NAND-type-cell word circuit 20. FIG. 5 is a block diagram showing the pre-charged state, FIG. 6 is that showing the matched state, FIG. 7 is that showing the mismatched state, and FIG. 8 is a circuit diagram of a NAND-type BCAM cell (BCAM cell is also referred as the word circuit) 30.

As shown in FIG. 8, the NAND-type word circuit 30 is implemented using a series of pass transistors 33 connected in series in the NAND-type cells. The NAND-type word circuit 30 operates in two phases: precharge phase and evaluate phase, based on the dynamic logic. In the precharge phase, the match line (ML) is charged through a PMOS transistor 33e.

In the evaluate phase, if a search word is the same as a stored word as shown in FIG. 6, all the pass transistors 21 in the CAM cells are in ON state. The CAM cells are memory cells as shown in FIG. 8 to be described later. Hence, the ML line capacitance is discharged. This state is called "match." In FIG. 6, the search word is simply shown in 3 bits as "101".

On the contrary, if the search word is different from the stored word as shown in FIG. 7, all the pass transistors 21 in the CAM cell are not in the ON state. Hence, the voltage of the ML line remains at a high level. This state is called "mismatch".

The power dissipation of the NAND-type word circuit 20 is lower than that of the NOR-type one because only the matched circuit discharges the ML capacitance.

As shown in FIG. 8, the binary NAND-type BCAM cell 30 includes: a flip-flop 32; and a first to a fifth transmission transistors 33 (33a to 33e). The transmission transistors are also called the transistors for transfer. In the BCAM cell 30, ML, SL, and the word line (WL) are installed. An ML signal is applied to the ML, an SL signal is applied to the SL, and a WL signal is applied to the WL.

The WL is activated only when the word is written into the cells, and is kept low during the search operation. In the write operation, all word entries are stored using complementary signals, namely BL and BL bar signals applied to the bit line. The data "0" and "1" correspond to (0, 1) and (1, 0), respectively. In the search operation, namely in the evaluate phase, search words are assigned using complementary signals, namely SL and SL bar signals, applied to the SL.

Once the search word is found to be the same as the stored word, the pass transistor 33e connected to the ML turns to the ON state.

Figure 9:
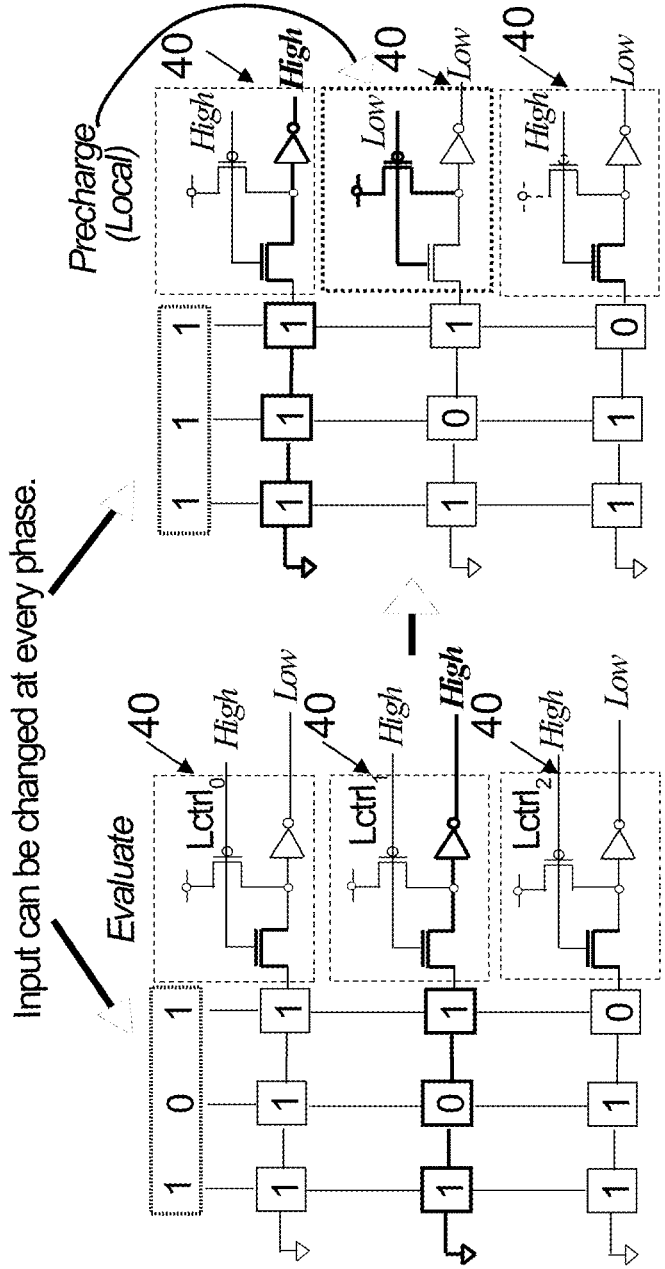
FIG. 9 is a block diagram of a self-timed word circuit based on phase-overlapped processing according to the present invention.

FIG. 9 is a block diagram of the self-timed word circuits 40 based on the phase overlapped processing (POP) scheme of the present invention. Only three word circuits 40 are shown.

As shown in FIG. 9, each word circuit 40 is asynchronously and independently controlled using its own local control signal (lctrl). The local control signal (lctrl) is high in an evaluate phase and low in a precharge phase.

In the word circuit 40 of the present invention, the ML of a matched word circuit 40 only is charged by the local control signal (lctrl) after the previous evaluate phase. Since the other local control signals (lctrl) remain high, the other word circuits 40 are still in the evaluate phase.

Furthermore, since the word overlapped search (WOS) scheme is used, the subsequent search words are assigned to other unused word circuits 40. Since the other unused word circuits 40 have already been in pre-charged state, the input search words can be processed without wasting the precharge time.

Figure 10:
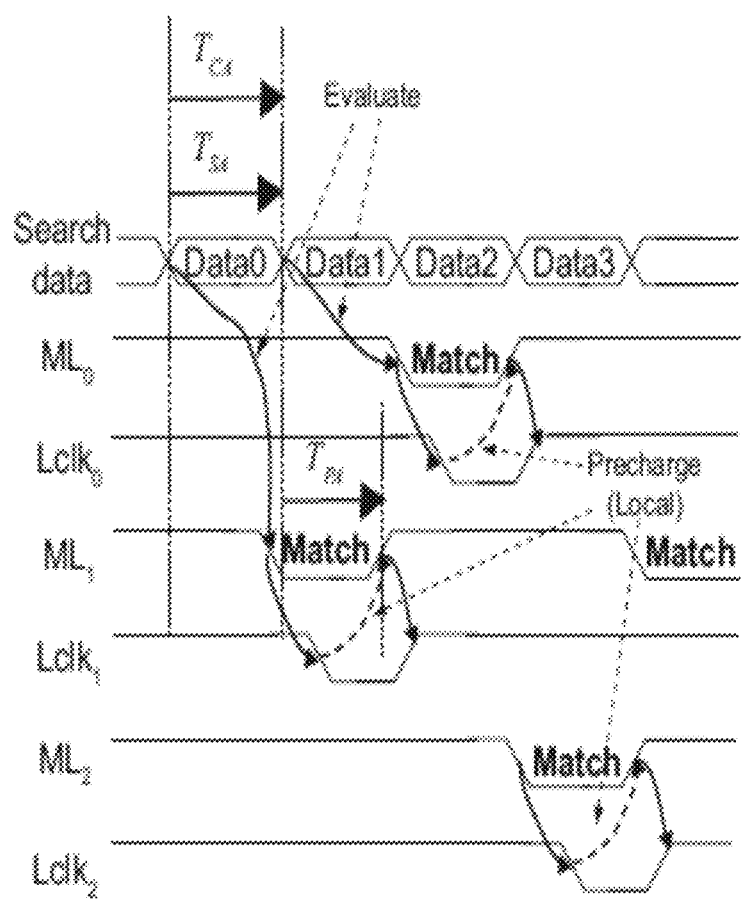
FIG. 10 is a figure showing the time chart describing the operation of the self-timed word circuit as shown in FIG. 9.

FIG. 10 is a time chart describing the operation of the self-timed word circuit 40 as shown in FIG. 9. As shown in FIG. 10, the ML of the matched word circuit is charged by the local control signal (lctrl) after the match operation. During this precharge phase, another search word is assigned to another unused word circuit 40 that is in the evaluate phase. Since these phases are overlapped, the delay time of the precharge phase $T_{PA}$ does not affect the cycle time $T_{CA}$. Hence, the self-control based on the POP operation is performed to be hiding the precharge-phase delay time $T_{PA}$. Normally, the delay time of the evaluate phase $T_{SA}$ is longer than the delay time of the precharge phase $T_{PA}$.

Therefore, the cycle time $T_{CA}$ is therefore given by Equation (6) as shown below.

$$T_{CA} = T_{SA} \quad (6)$$

With the semiconductor storage device 1 of the present invention, the phase overlapped processing (POP) based on the self-control in the word block 4 of the CAM block 2 may be allowed to be the conventional synchronous type.

Figure 11:
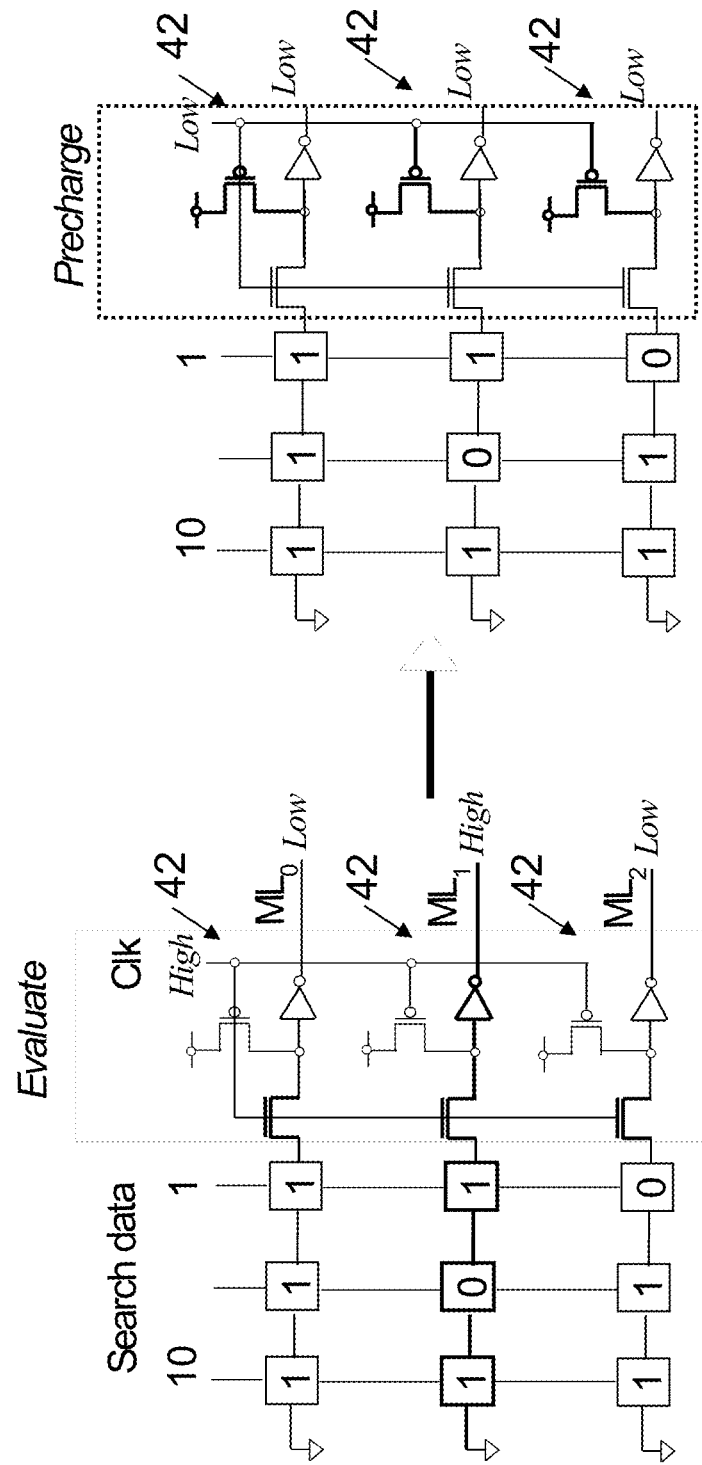
FIG. 11 is a block diagram of a synchronous word circuit.
Figure 12:
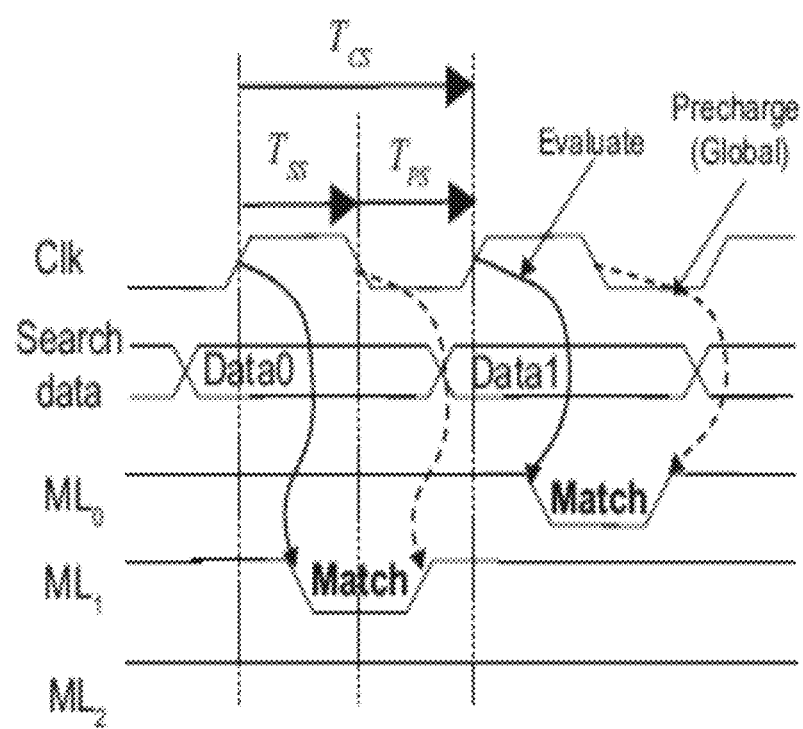
FIG. 12 is a time chart describing the operation of the circuit as shown in FIG. 11.

FIG. 11 is a block diagram of a synchronous word circuit 42, and FIG. 12 is a time chart describing the operation of the word circuit as shown in FIG. 11.

As shown in FIG. 11, when the word circuit 42 is the synchronous type, a clock signal, namely a comprehensive control signal, is applied to the gate of each transistor 21 for charging. Specifically, a high-level clock signal is applied in the evaluate phase, and in the precharge phase, a low-level clock signal is applied.

Hence, the cycle time of the synchronous CAM $T_{CS}$ of the word circuit 42 is given by Equation (7) as shown below.

$$T_{CS}=T_{SS}+T_{PS} \tag{7}$$

In the above equation, $T_{SS}$ is the search time given by Equation (5), namely the delay time of the evaluate phase. $T_{PS}$ is the delay time of the precharge phase. Since $T_{SS}$ is normally longer than $T_{PS}$, and both delay times are the same in the synchronous CAM, Equation (7) is redefined by Equation (8) as shown below.

$$T_{CS}=2T_{SS} \tag{8}$$

The duty ratio of the clock signal in the synchronous circuit is 50%. In other words, as shown by Equation (7), since the high-level period (evaluate-phase period) and the low-level period (precharge-phase period) of the clock signal are the same, the clock cycle is twice the duration of the evaluate-phase period as shown in Equation (8).

The throughput ratio of the semiconductor storage device 1 of the present invention to the conventional synchronous CAMs is given by Equation (9) as shown below.

$$\text{Throughput ratio} = \frac{T_{CS}}{T_{CA}} \tag{9}$$

Furthermore, by substituting Equations (2), (5), and (7) into Equation (9), the throughput ratio in the above Equation (9) is given by Equation (10) as shown below.

$$\text{Throughput ratio} \cong \frac{2(T_{reg}+T_{1st}+T_{2ns})}{T_{1st}} \tag{10}$$

In the above equation, when the number of bits k in the first sub word is set to 8, the delay time of the evaluate phase $T_{SA}$ is roughly equal to $T_{1st}$. If the word block 4 of the present invention is in the self-timed operation, the cycle time of the semiconductor storage device 1 is not affected by the precharge delay time. Hence, compared with the conventional synchronous CAM, the self-timed word block 4 has significantly shorter delay time, namely its throughput increases.

Next, the semiconductor storage device 1A including WOS and POP schemes will hereinafter be described.

Figure 13:
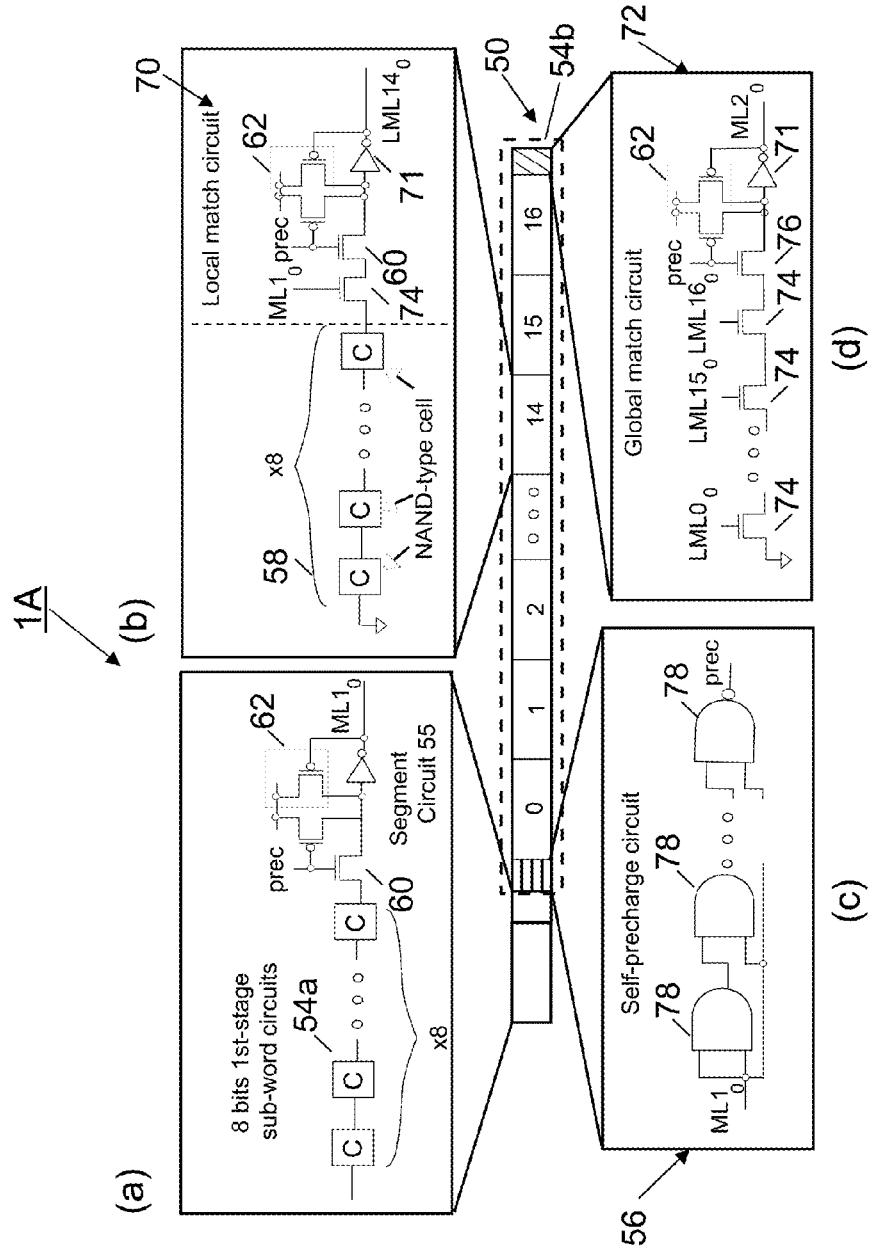
FIG. 13 is a circuit diagram showing the word circuit of the CAM according to the present invention.

FIG. 13 is a circuit diagram of a word circuit 50 including WOS and POS schemes. As shown in FIG. 13, the word circuit 50 of the present invention includes: an 8-bit 1st-stage sub-word circuit 54a; a segmentation circuit 55; a self-precharge circuit 56; and a 136-bit 2nd-stage sub-word circuit 54b.

As shown in FIG. 13 (*a*), the 8-bit 1st-stage sub-word circuit 54a includes: 8 NAND-type cells 58; a self-precharge PMOS transistor 60; and a weak-feedback PMOS transistor 62.

Once the 8-bit sub word is input into these 8 NAND cells 58 from the input controller 3, it is compared with the stored 8-bit sub word. The output of the segmentation circuit 55 $ML1_0$ is high when the input sub word matches the stored word, and remains low when it mismatches the stored word.

The ML is charged through the self-precharge PMOS transistor 60 controlled by the self-precharge circuit 56. The weak feedback PMOS transistor 62 is used to solve a charge-sharing problem of the ML in the NAND-type cells 58 (Non-patent Literatures 14, 15, 24). $ML1_0$ is connected to the self-precharge circuit 56 and to the 136-bit 2nd-stage sub-word circuit 54b.

The 136-bit 2nd-stage sub-word circuit 54b includes: 17 local match circuits 70; and a global match circuit 72. The match circuit is defined as a circuit for judging the match between the search word and the stored word. This operation is performed in the match circuit. This hierarchical design divides a word circuit 50 into the local match circuits 70 and the global match circuit 72 (Non-patent literature 25).

As shown in FIG. 13 (*b*), each local match circuit 70 includes: an inverter 71; a self-precharge PMOS transistor 60; a weak feedback PMOS transistor 62; 8 NAND-type cells (sub-sub-word circuits) 58; and an NMOS transistor 74 whose gate is connected to $ML1_0$ output from the segmentation circuit 55. Once $ML1_0$ is asserted, namely is made effective, all the 17 local match circuits 70 operate. In other situations, the 17 local match circuits 70 do not operate because the 8-bit first-stage sub word circuit 54a mismatches.

The remaining 136-bit sub word 54b is sent from the input controller 3 in parallel, and is partitioned into the 8-bit 17 sub-sub words. Each sub-sub word is processed in its local match circuit 70.

The output of each local match circuit 70 ($LMLi_0$ ($0 \le i < 17$)) is high when the input sub-sub word matches, and low when the input sub-sub word mismatches. The delay time from $ML1_0$ to $LMLi_0$ is defined as $T_{2ndL}$.

Every output $LMLi_0$ is connected to the global match circuit 72.

As shown in FIG. 13 (*d*), the global match circuit 72 includes: 17 NMOS transistors 74 connected in series; a self-precharge PMOS transistor 60; a weak feedback PMOS transistor 62; and an inverter 71. Each output of $LMLi_0$ is input into each gate of the series of 17 NMOS transistors 74 of the global match circuit 72.

When every output $LMLi_0$ is asserted, namely is made effective, the output $ML2_0$ of the global match circuit 72 is made effective, namely high level is output. This means that the search word matches the stored word. In other situations, $ML2_0$ remains at low level.

The delay time from $LMLi_0$ to $ML2_0$ is defined as $T_{2ndG}$. Hence, the delay time $T_{2nd}$ of the 2nd-stage segment 54b is given by Equation (11) as shown below.

$$T_{2nd}=T_{2ndL}+T_{2ndG} \tag{11}$$

While the 2nd-stage segment is operating, the self-precharge circuit 56 as shown in FIG. 13 (*c*) is also operating. As shown in FIG. 13 (*c*), in the self-precharge circuit 56, the AND gates 78 are connected in series. When $ML1_0$ is asserted, namely is made effective, the delay time $T_{delay}$ is defined.

The output of the self-precharge circuit 56 is de-asserted after the delay time $T_{delay}$ elapses. Then, the self-precharge circuit 56 charges all the MLs of the word circuit 50.

Figure 14:
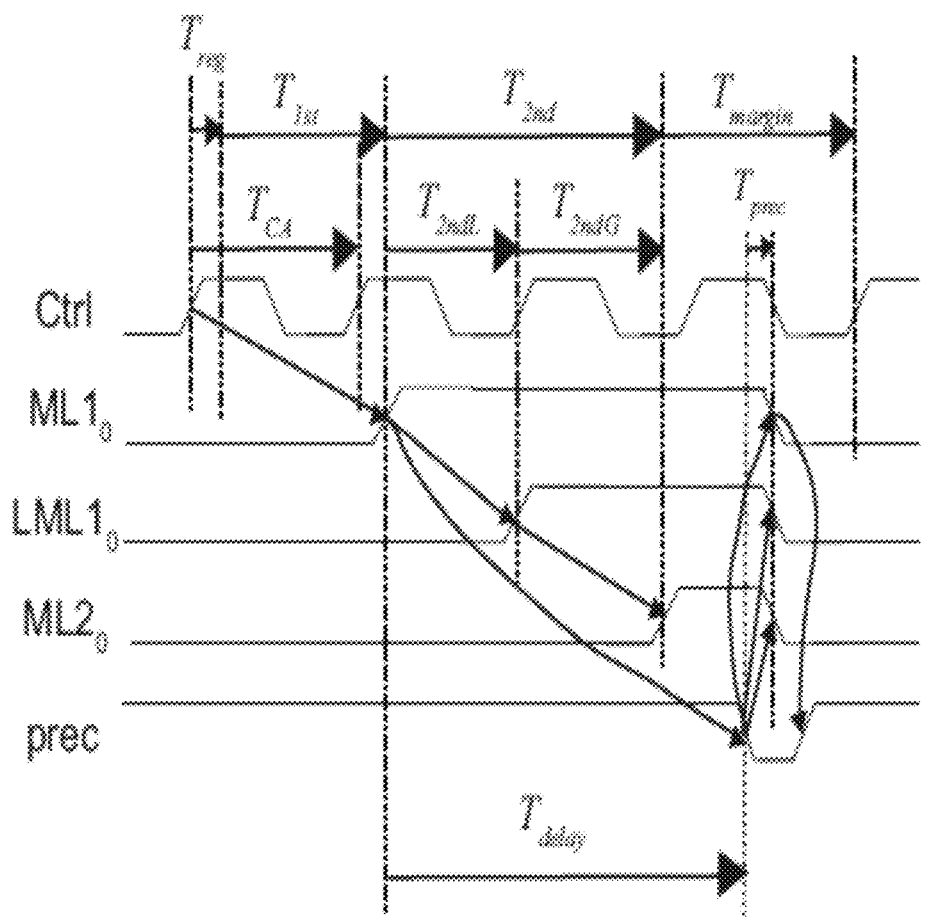
FIG. 14 is a time chart showing the operation of the word circuit as shown in FIG. 13.

FIG. 14 is a time chart showing the operation of the word circuit 50 as shown in FIG. 13.

As shown in FIG. 14, the search word is divided into 8-bit and the 136-bit sub words, and they are sent from the input controller 3 at a rate based on the cycle $T_{CA}$. Once the 8-bit sub word 54a matches in the first segment, the remaining 136-bit sub word 54b is processed in the subsequent segment. Since the search words are changed based on the cycle time $T_{CA}$, the 136-bit sub word needs to be assigned to the local match circuits 70, namely made effective, within $T_{CA}$. Hence, the delay time of the local match circuits 70 needs to satisfy the condition as shown by Equation (12).

$$T_{2ndL} < T_{CA} \qquad (12)$$

When each sub-sub word matches in its local match circuit 70, the global match circuit 72 determines whether the search word matches or not. Concurrently, the self-precharge circuit 56 operates.

Since all the MLs must be charged after the operation of the global match circuit 72, the delay time $T_{delay}$ needs to satisfy the condition as shown by Equation (13).

$$T_{delay} > T_{2nd} \qquad (13)$$

The next search word can be asserted after $T_{slow}$ in the matched word circuit 70. Hence, $T_{slow}$ must satisfy the condition as shown by Equation (14).

$$T_{slow} > T_{reg} + T_{1st} + T_{delay} + T_{prec} \qquad (14)$$

In the above equation, $T_{prec}$ represents the precharge delay time of all the MLs.

Using Equations (3), (4), and (14), the number (m) of subsequent sub words 54b to be compared is determined by Equation (15) as shown below.

$$m = \frac{(T_{reg} + T_{delay} + T_{prec})}{T_{1st}} \qquad (15)$$

In the above equation, cycle time $T_{CA}$ as shown in FIGS. 10 and 14 is roughly equal to $T_{1st}$.

(256×144-Bit Semiconductor Storage Device)

A 256×144-bit semiconductor storage device 1, 1A of the present invention will be described.

The 256×144-bit semiconductor storage device 1, 1A of the present invention is compared with the conventional synchronous CAM based on the segmentation method. The number of bits of the 1st-stage sub word of the conventional synchronous CAM in the Comparative Example is k=8, and the number of bits (n-k) of the 2nd-stage sub word is 136. The semiconductor storage device 1, 1A of the present invention has the same word structure. The 2nd-stage sub-word structure of the semiconductor storage device 1, 1A of the present invention is implemented based on the hierarchical style (see Non-patent Literature 25 for hierarchical style sub words).

The performances of the semiconductor storage device 1, 1A of the present invention and that of the Comparative Example are evaluated based on the 90-nm CMOS technology. The stored words have a uniform random distribution. 90 nm is the minimum feature size of the used manufacturing process technology of the CMOS.

(Evaluation of the Delay Time)

Table 1 shows the delay time of each circuit of the semiconductor storage device 1 of the present invention. Specifically, the delay time of each circuit of the semiconductor storage device 1 of the present invention was evaluated by using the Simulation Program with Integrated Circuit Emphasis (SPICE by Synopsys), i.e. HSPICE, as software.

The drain voltage of the MOS transistor was set to $V_{DD}$=1 V, and temperature was set at the room temperature.

The self-precharge circuit 56 was designed to satisfy Equation (13). m was set to 3 by using Equation (15). Hence $T_{CA}$ was found to be 261 ps (1 ps=$10^{-12}$ s) using Equations (2) and (8). Due to the manufacturing process fluctuations, $T_{2nd}$ may become larger than $T_{delay}$, and in that case Equation (13) cannot be satisfied. However, it is possible to satisfy Equation (15) by setting m to more than 3, which affects the area of the input controller 3, but does not directly affect the cycle time $T_{CA}$.

As shown in Table 1, $T_{reg}$ is 51 ps, $T_{1st}$ is 259 ps, $T_{2ndL}$ is 225 ps, $T_{2ndG}$ is 243 ps, $T_{delay}$ is 500 ps, and $T_{prec}$ is 81 ps.

TABLE 1

|  | $T_{reg}$ | $T_{1st}$ | $T_{2ndL}$ | $T_{2ndG}$ | $T_{delay}$ | $T_{prec}$ |
|---|---|---|---|---|---|---|
| Delay time (ps) | 51 | 259 | 225 | 243 | 500 | 81 |

Figure 15:
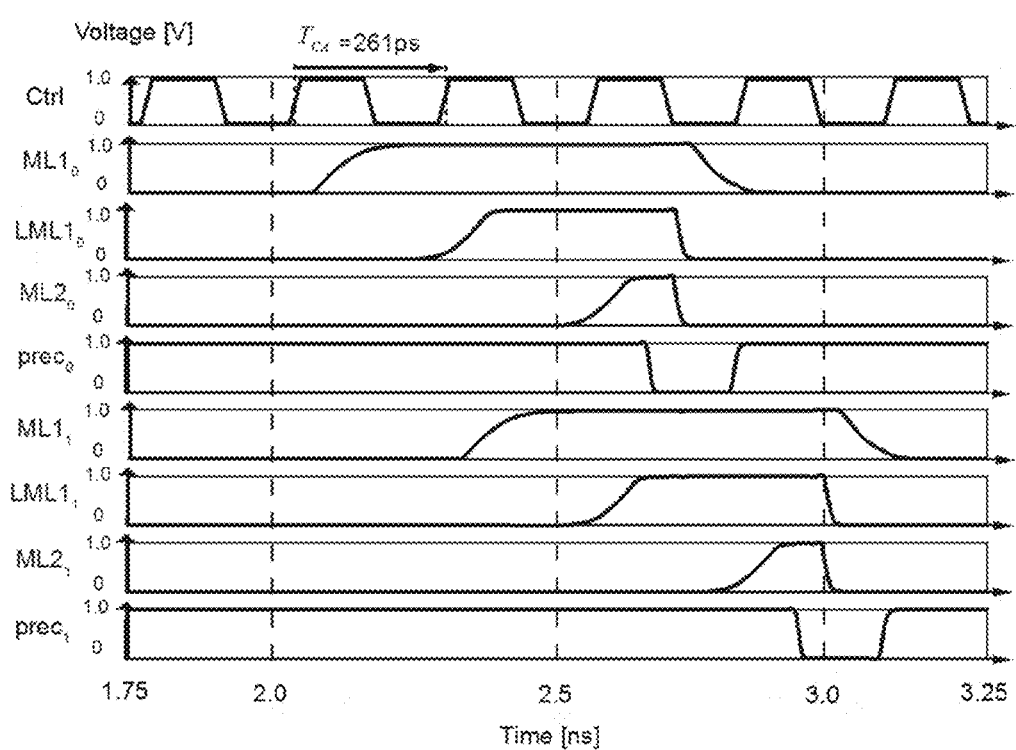
FIG. 15 is a timing chart showing the simulation result of the CAM with the minimum feature size of 90 nm according to the present invention.

FIG. 15 is a timing chart showing the result of the simulation of the 90-nm CMOS process semiconductor storage device 1, 1A of the present invention. As shown in FIG. 15, since the subsequent search words are assigned to different unused word circuits, the semiconductor storage device 1, 1A of the present invention operates at the rate based on short cycle delay $T_{CA}$.

(Cycle Time)

Figure 16:
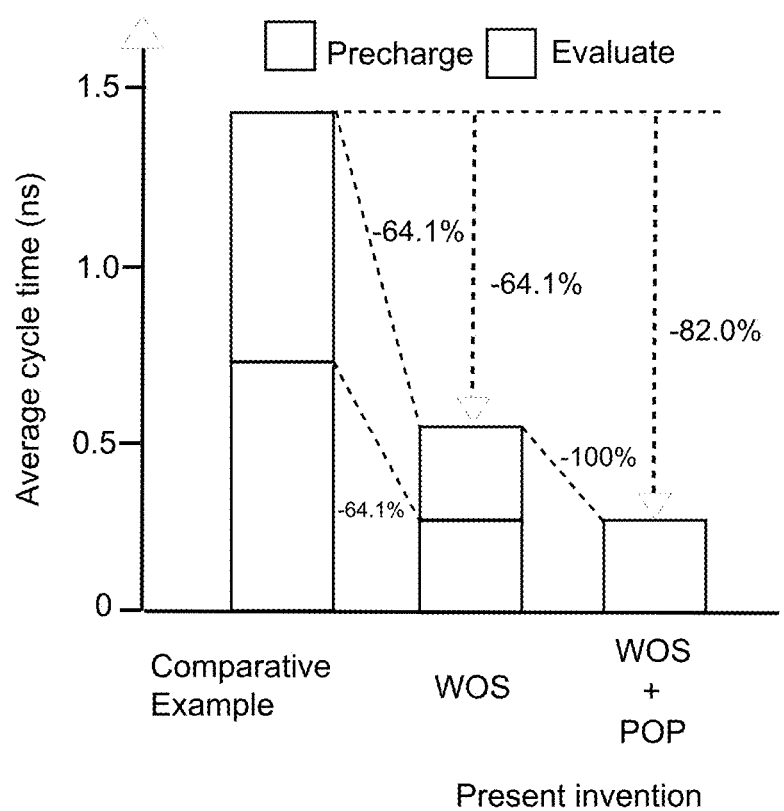
FIG. 16 is a chart comparing the cycle time of the self-timed CAM according to the present invention and that of the CAM in the Comparative Example.

FIG. 16 shows the comparison of the cycle time between the self-timed semiconductor storage device 1, 1A of the present invention and the CAM in the Comparative Example.

As shown in FIG. 16, the cycle time of the CAM in the Comparative Example is 1454 ps determined by Equation (7). The cycle time of the semiconductor storage device 1 of the present invention using WOS scheme is determined by the delay time of the 1st-stage sub-word circuit. Hence, the cycle time of the semiconductor storage device 1 using WOS scheme of the present invention is reduced by 64.1% to 555 ps compared to the conventional CAM.

Furthermore, since the cycle time of the semiconductor storage device 1A of the present invention using WOS and POP schemes is not affected by precharge delay time, the cycle time is reduced by 82% to approximately 261 ps compared to the conventional CAM.

(Energy Dissipation)

Next, the energy dissipation of the semiconductor storage device 1, 1A will hereinafter be described.

The energy dissipation of the semiconductor storage device 1, 1A is given by Equation (16) as shown below.

$$E_{total} = E_{match} + E_{search} + E_{ctrl} \qquad (16)$$

In the above equation, $E_{match}$, $E_{search}$, and $E_{ctrl}$ represent the energy dissipations of MLs, SLs, and control signals, respectively.

When the input of the first 8-bit sub word 54a mismatches in the 1st-stage sub-word circuits, the local match circuits 70 do not operate. In addition, the global match circuit 72 operates only when each sub-sub word matches in its local match circuit 70. Hence, the energy dissipation of the MLs is given by Equation (17) as shown below.

$$E_{match} = E_{1st}\left(\frac{1}{2}\right)^k + 17 E_{2ndL}\left(\frac{1}{2}\right)^{16} + E_{2ndG}\left(\frac{1}{2}\right)^{144} \qquad (17)$$

In the above equation, $E_{1st}$, $E_{2ndL}$ and $E_{2ndG}$ represent the energy dissipation of the 1st-stage sub-word circuit 54a, the local match circuit 70, and the global match circuit 72, respectively.

The switching activity of the MLs is very low, and SLs are changed when a new search word is assigned.

(Energy Dissipation of the Conventional CAM)

The energy dissipation of the control signals $E_{ctrl}$ of the conventional synchronous CAM is related to the clock signal, namely the global control signal. The clock signal turns on all self-precharge PMOS transistors 60 (FIG. 10). Hence, the energy dissipation of the control signal of the conventional synchronous CAM $E_{ctrl(sync)}$ is given by Equation (18) as shown below.

$$E_{ctrl(sync)} = E_{clk\_buffer} + E_{prec} \quad (18)$$

In the above equation, $E_{clk\_buffer}$ is the energy dissipation of the clock buffer, and $E_{prec}$ is the energy dissipation to charge all self-precharge PMOS transistors 60.

(Energy Dissipation of the Semiconductor Storage Device of the Present Invention)

Unlike the conventional synchronous CAM, the energy dissipation of the input signal $E_{ctrl(self)}$ of the semiconductor storage device 1A of the present invention is related to local control signal (lctrl) of the self-timed semiconductor storage device 1A. Since the precharge transistors in matched word circuits only are turned on by a prec signal (precharge signal), the energy dissipation for charging the precharge PMOSFET 60 is reduced. Furthermore, since the precharge circuit 56 operates only when the 1st-stage segment matches, the energy dissipation of the control signal $E_{ctrl(self)}$ of the semiconductor storage device 1A of the present invention is given by Equation (19) as shown below.

$$E_{ctrl(self)} = (E_{prec} + E_{self\_precharge})\left(\frac{1}{2}\right)^8 \quad (19)$$

In the above equation, $E_{self\_precharge}$ is the energy dissipation of the precharge circuit.

the synchronous CAM in the Comparative Example is 1454 ps, meaning that the throughput of the semiconductor storage device 1A of the present invention is 5.57 times larger than that of the CAM in the Comparative Example.

TABLE 2

|  |  | CAM of the present invention | Conventional synchronous CAM |
|---|---|---|---|
| Average cycle time (ps) |  | 261 | 1454 |
| Energy dissipation/search (fJ/bit/search) | Match | 0.0006 | 0.0003 |
|  | Search | 0.160 | 0.160 |
|  | Ctrl | 0.001 | 0.103 |
|  | Total | 0.162 | 0.263 |
| Number of transistors |  | 408k | 372k |

Since the semiconductor storage device 1A of the present invention uses local control signals (lctrl), the energy dissipation of control signals decreases. Consequently, the total energy dissipation has decreased to 61.6% of the synchronous CAM in the Comparative Example.

Since the semiconductor storage device 1A of the present invention controls the word circuits locally, a self-precharge control circuit is required. Hence, the area of the CAM of the present invention slightly increases by 8%. The number of transistors of the semiconductor storage device 1A of the present invention is 408 k (408,000), whereas that of the synchronous CAM in the Comparative Example is 372 k (372,000).

Table 3 compares the semiconductor storage device 1A of the present invention with conventional devices. The benefits of the hybrid device include the low power consumption achieved by NAND-type cells and high-speed operation achieved by NOR-type cells.

The cycle time of the semiconductor storage device 1A of the present invention has decreased to 8% of the hybrid CAM whose minimum feature size is 0.1 μm, and the energy consumption/bit per search has decreased to 23%. Furthermore, the semiconductor storage device 1A of the present invention operates at the speed approximately three times faster than the NAND-type CAM having the minimum feature size of 65 nm.

TABLE 3

| (Non-patent Literature) | Present invention | PF-CDPD (14) | Current save (17) | Pipeline (18) | Hybrid (21) | Ipv6 macro (23) |
|---|---|---|---|---|---|---|
| Structure | 256 × 144 | 256 × 128 | 256 × 144 | 1024 × 144 | 1024 × 144 | 256 × 144 |
| CAM | BCAM | BCAM | TCAM | TCAM | TCAM | TCAM |
| Cell | NAND | NAND | NOR | NOR | NAND + NOR | NAND |
| Manufacturing technology | 90 nm | 0.18 μm | 0.13 μm | 0.18 μm | 0.10 μm | 65 nm |
| Cycle time (ns) | 0.26 | 5 | 4 | 7 | 3.3 | >0.76 |
| Energy consumption/search (fJ/bit/search) | 0.162 | 2.33 | 1.3 | 2.89 | 0.7 | 0.113 |

(Energy Dissipation of the Semiconductor Storage Device of the Present Invention)

Table 2 shows the comparison of the energy dissipation between the semiconductor storage device 1A of the present invention and the CAM in the Comparative Example. The average cycle time and the number of transistors used are also shown.

The average cycle time of the semiconductor storage device 1A of the present invention is 261 ps, whereas that of (Modification)

Next, a case where the memory cell of the semiconductor storage device 1, 1A of the present invention is ternary content-addressable memory (TCAM) will hereinafter be described.

The TCAM handles the following three states: "0," "1," and "X." "X" is also called as "Don't care."

Figure 17:
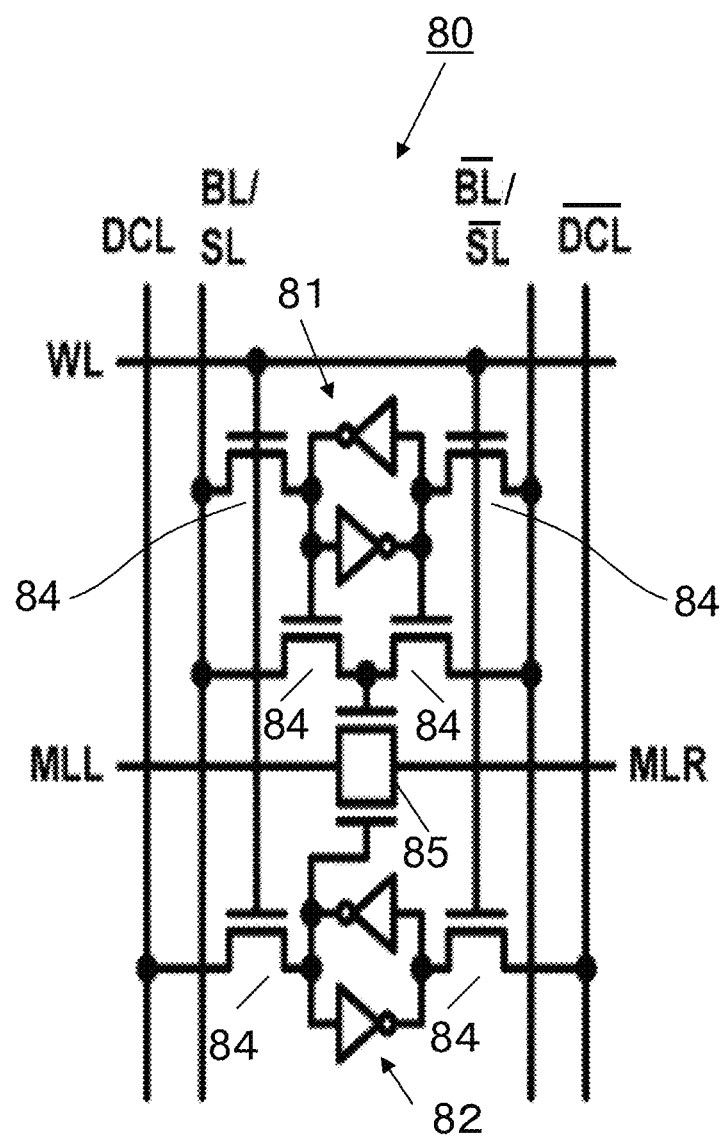
FIG. 17 is a circuit diagram of a TCAM.
Figure 18:
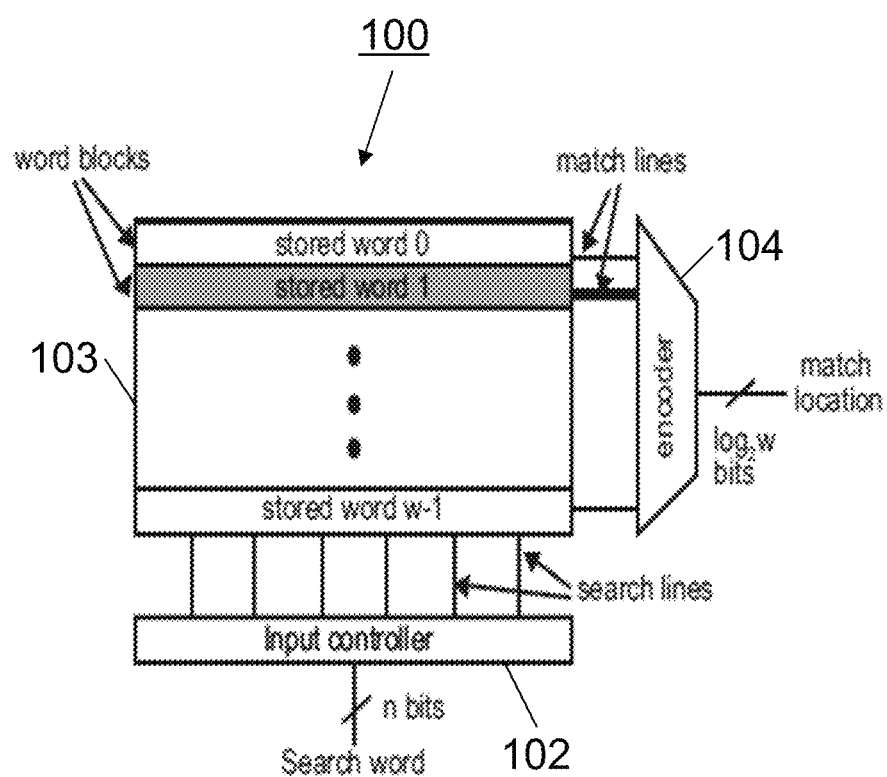
FIG. 18 is a block diagram showing the structure of the conventional CAM.

FIG. 17 is a circuit diagram of TCAM 80. As shown in FIG. 17, the TCAM 80 is in a structure where two BCAM memory cells 30 as shown in FIG. 8 are placed in parallel with respect to the match line (ML). Specifically, the TCAM 80 includes: an upper-stage NAND-type first memory cell 81 for storing "0" and "1"; a lower-stage NAND-type second memory cell 82 for storing "X"; a plurality of transistors 84 for transmission; and a transistor 85 for transmission for MLs. WL, BL/SL, and BL bar/SL bar are connected to the NAND-type first memory cell 81. WL, Don't care line (DCL), and DCL bar are connected to the NAND-type second memory cell 82. The ML is connected to the NAND-type first memory cell 81 and the NAND-type second memory cell 82 via the transistors 85 for transmission for MLs.

By using the TCAM 80 typified in FIG. 17 as the CAM block 2 of the semiconductor storage device 1, 1A as shown in FIG. 1, and allowing the input controller 3, etc. to handle the ternary data instead of the binary data, the semiconductor storage device 1, 1A operates as the ternary-data content-addressable memory.

The present invention is not limited to the examples described above, but various modifications are allowed within the scope of the claims of the present invention. Needless to say, they are all included in the scope of the present invention.

What is claimed is:

1. A semiconductor storage device, comprising:
an input controller including a register, a comparator, and a mode controller; and
a content-addressable memory block connected to the input controller, the content-addressable memory block comprising a plurality of word circuits, wherein
each of the word circuits comprises: a k-bit 1st-stage sub-word circuit connected to a first search line of the input controller; an (n-k)-bit (where n-k>k) 2nd-stage sub-word circuit connected to a second search line of the input controller, and a segmentation circuit connected between the 1st-stage sub-word circuit and the 2nd-stage sub-word circuit,
the 2nd-stage sub-word circuit comprises: a plurality of local match circuits, each having a sub-sub-word circuit connected thereto; and a global match circuit,
the input controller sends a search word to the sub-sub-word circuit of each of the local match circuits in parallel,
the local match circuits judge a match between the search word and a stored word in the sub-sub-word circuit of each of the local match circuits, and
the local match circuits output to the global match circuit.

2. The semiconductor storage device as set forth in claim 1, wherein the number of bits of the sub-sub-word circuits is k bits.

3. The semiconductor storage device as set forth in claim 1, wherein, in a search performed by the content-addressable memory block, match lines in each word circuit are charged before next search is performed, and only the match lines that match in the word circuit are charged by a local control signal generated in the word circuit.

4. The semiconductor storage device as set forth in claim 3, wherein the word circuit includes a self-precharge circuit.

5. The semiconductor storage device as set forth in claim 1, wherein the match circuit is asynchronously or synchronously controlled on a word to word basis.

6. The semiconductor storage device as set forth in claim 1, wherein the input controller is driven by a synchronous or asynchronous signal.

7. The semiconductor storage device as set forth in claim 1, wherein the content-addressable memory block comprises binary content-addressable memory cells.

8. The semiconductor storage device as set forth in claim 1, wherein the content-addressable memory block comprises ternary content-addressable memory cells.

9. The semiconductor storage device as set forth in claim 1, wherein
the global match circuit comprises: a plurality of transistors connected in series; a self-precharge transistor; a weak feedback transistor; and an inverter, and
each of the local match circuits is connected to each gate of the series of transistors corresponding to each of the local match circuits.

10. A semiconductor storage device comprising:
an input controller including a register, a comparator, and a mode controller; and
a content-addressable memory block connected to the input controller, the content-addressable memory block comprising a plurality of word circuits, wherein
each of the word circuits comprises: a k-bit 1st-stage sub-word circuit connected to a first search line of the input controller; an (n-k)-bit 2nd-stage sub-word circuit connected to a second search line of the input controller; and a segmentation circuit connected between the 1st-stage sub-word circuit and the 2nd-stage sub-word circuit,
the input controller operates in fast and slow modes, and
the input controller operates in the fast mode, after judging that the k-bit 1st-stage sub word does not match a search word so as to continue a series of match operations for different inputs.

11. A semiconductor storage device comprising:
an input controller including a register, a comparator, and a mode controller; and
a content-addressable memory block connected to the input controller, the content-addressable memory block comprising a plurality of word circuits, wherein
each of the word circuits comprises: a k-bit 1st-stage sub-word circuit connected to a first search line of the input controller; an (n-k)-bit 2nd-stage sub-word circuit connected to a second search line of the input controller; and a segmentation circuit connected between the 1st-stage sub-word circuit and the 2nd-stage sub-word circuit, the input controller operates in fast and slow modes, and
the input controller operates in the slow mode after judging that a stored word in the 1st-stage sub word circuit matches a search word.

12. A semiconductor storage device comprising:
an input controller including a register, a comparator, and a mode controller; and
a content-addressable memory block connected to the input controller, the content-addressable memory block comprising a plurality of word circuits, wherein
each of the word circuits comprises: a k-bit 1st-stage sub-word circuit connected to a first search line of the input controller; an (n-k)-bit 2nd-stage sub-word circuit connected to a second search line of the input controller; and a segmentation circuit connected between the 1st-stage sub-word circuit and the 2nd-stage sub-word circuit,
in a search performed by the content-addressable memory block, match lines in each word circuit are charged before next search is performed, and the match lines of the word circuit are charged after a global match circuit in the word circuit is operated.

13. A semiconductor storage device comprising:
an input controller including a register, a comparator, and a mode controller; and a content-addressable memory block connected to the input controller, the content-addressable memory block comprising a plurality of word circuits, wherein each of the word circuits comprises: a k-bit 1st-stage sub-word circuit connected to a first search line of the input controller; an (n-k)-bit 2nd-stage sub-word circuit connected to a second search line of the input controller; and a segmentation circuit connected between the 1st-stage sub-word circuit and the 2nd-stage sub-word circuit, the 2nd-stage sub-word circuit comprises: a plurality of local match circuits, each having a sub-sub-word circuit connected thereto; and a global match circuit, the match circuit is asynchronously controlled on a word to word basis, match lines of a matched word are self-precharged by a local control signal after a series of operations of judging match between a search word and a stored word, and the delay time $T_{PA}$ in the self-precharge is operated so as not to affect the cycle time $T_{CA}$ of the content-addressable memory block.

* * * * *